United States Patent [19]

Shannon et al.

[11] 4,045,248
[45] Aug. 30, 1977

[54] MAKING SCHOTTKY BARRIER DEVICES

[75] Inventors: John Martin Shannon, Whyteleafe; Julian Robert Anthony Beale, Redhill, both of England

[73] Assignee: U.S. Philips Corporation, New York, N.Y.

[21] Appl. No.: 599,088

[22] Filed: July 25, 1975

Related U.S. Application Data

[62] Division of Ser. No. 480,540, June 18, 1974, Pat. No. 3,943,552.

[30] Foreign Application Priority Data

June 26, 1973 United Kingdom ............... 30179/73

[51] Int. Cl.$^2$ ........................................... H01L 21/26
[52] U.S. Cl. ...................... 148/1.5; 148/33; 148/187; 357/15
[58] Field of Search ................... 148/1.5; 357/15

[56] References Cited

U.S. PATENT DOCUMENTS

| | | | |
|---|---|---|---|
| 3,652,908 | 3/1972 | Lepselter et al. | 148/1.5 X |
| 3,858,304 | 1/1975 | Leedy et al. | 357/15 X |
| 3,914,784 | 10/1975 | Hunsperger et al. | 357/15 X |

OTHER PUBLICATIONS

Broom et al. "Vertical Schottky Diode-Memory Device" IBM Tech. Disc. Bull., vol. 15, No. 7, Dec. 1972, p. 2158.
Knepper, "Reducing Series Resistance of a Schottky Barrier Diode-Etc." IBM Tech. Disc. Bull., vol. 17, No. 6, Nov. 1974, pp. 1609, 1610.

*Primary Examiner*—G. Ozaki
*Attorney, Agent, or Firm*—Frank R. Trifari; Jack Oisher; Steven R. Biren

[57] ABSTRACT

A semiconductor device comprising a semiconductor body portion having a shallow surface layer which is higher doped than the bulk of the semiconductor body portion, and a metal electrode on this layer and forming a Schottky barrier with the body portion. The layer serves to control the effective height of the barrier. The depth of the layer is such that the layer is substantially depleted of charge carriers in the zero bias condition whereby the slope of the reverse current-voltage characteristic of the barrier below break-down is determined by the doping of the bulk of the body portion substantially independently of the presence of the layer. Depending on the conductivity type of the layer relative to the bulk, the barrier can be higher or lower than that which would be formed in the absence of this layer. By providing the layer by implantation good control of the doping and hence of the barrier height can be obtained. Applicable to both discrete Schottky diodes and Schottky barriers in integrated circuits.

19 Claims, 9 Drawing Figures

MAKING SCHOTTKY BARRIER DEVICES

This is a division of application Ser. No. 480,540, filed June 18, 1974, now U.S. Pat. No. 3,943,552.

This invention relates to a semiconductor device comprising a semiconductor body having a shallow surface layer which has a higher doping level than the underlying semiconductor body portion, and a metal electrode on the shallow surface layer and forming a Schottky barrier with the semiconductor body, the shallow surface layer serving to control the effective height of the barrier. The invention further relates to a method of manufacturing such a semiconductor device.

Schottky barrier technology is fulfilling an increasingly important role in semiconductor devices and circuits, for example for microwave and power Schottky diodes, for so-called "Schottky-clamped T.T.L." (transistor-transistor logic circuits), and for so-called "Integrated-injection logic" circuits ($I^2L$).

The height of a Schottky barrier is determined by the difference in work functions of the semiconductor and metal forming the barrier. At present, when different barrier heights are required for different circuit applications, different metals are chosen. However, this can be disadvantageous. Some metals are reactive or difficult to etch. Some metals, for example aluminium, may be desirable for use in monolithical integrated circuit technology but may form an undesirable barrier height for the circuit.

It is known that the height of Schottky barriers formed on non-highly doped semiconductor body portions (for example n-type silicon having a doping of the order of $10^{15}$ donor atoms/cm$^3$) is substantially independent of the level of doping. However, if the doping is increased to a high level, for example approximately $5 \times 10^{17}$ dopant atoms/cm$^3$ the effective barrier height is decreased and varies with applied voltage. This is thought to be caused by tunnelling of charge-carriers across the barrier which is narrowed as a result of the greater bending of the semiconductor energy bands adjacent the metal layer due to the increased semiconductor doping. However, the reverse characteristic of such a barrier of decreased height is seriously degraded. The reverse break-down voltage of the barrier is lowered considerably by the increased semiconductor doping, and may be only a few volts. The reverse current before break-down is no longer substantially constant but increases with applied voltage as the effective barrier height decreases.

It should be noted that Schottky barriers have been made by providing a metal electrode on a dopant-implanted semiconductor body portion. In this connection reference is invited to the article "Device Fabrication by Ion Implantation" by A.U. MacRae in Radiation Effects, 1971, Vol. 7, pages 59 to 63, and to the article "Low-Power Bipolar Transistor Memory Cells", by D.A. Hodges et al, in I.E.E.E., Journal of Solid-State Circuits, Vol. SC-4, No.5, October 1969, P-280 - 284. The latter-mentioned article describes the use of a low-barrier Schottky diode formed by rhodium silicide on an implanted p-type silicon body portion. This body portion has a depth of 0.65 microns (6,500A) and is formed as a p-type well by boron implantation into the n-type epitaxial layer of the monolithic integrated circuit. The well has a surface doping of $5 \times 10^{16}$ atoms/cm.$^3$ and a peak doping of $10^{17}$ atoms/cm$^3$. This low-barrier Schottky diode has a degraded reverse characteristic as described in the previous paragraph of this Specification and as shown in FIG. 2 of the said article, the leakage current being highly dependent on the magnitude of the reverse voltage. The increase of reverse current with applied voltage is used to provide a compact 20 k.ohm resistor function passing a current of 50 micro Amps at 1 volt.

It is an object of the present invention to change the effective height of a Schottky barrier for a given metal-semiconductor system without seriously degrading the reverse characteristics of that metal-semiconductor barrier.

According to a first aspect of the present invention, there is provided a semiconductor device comprising a semiconductor body having a shallow surface layer which has a higher doping level than the underlying semiconductor body portion, and a metal electrode on the shallow surface layer forming a Schottky barrier with the semiconductor body, the shallow surface layer serving to control the effective height of the barrier, characterized in that the depth of the shallow surface layer is such that the layer is substantially depleted of charge carriers in the zero bias condition as a result of which the slope of the reverse current-voltage characteristics (which is the impedance in the reverse bias condition) of the barrier below break-down is determined by the doping of the said semiconductor substitute body portion substantially independently of the presence of the said shallow surface layer.

The higher doping level of the shallow surface layer may be either of the same conductivity type as the doping of the said semiconductor body portion or of opposite conductivity type to the doping of the said portion. The terms "doping", "doped" and "dopants" used in this Specification relate to conductivity type determining impurity atoms, either donor or acceptors.

The Schottky barrier of such a device, when compared with the Schottky which the metal electrode would form with the said semiconductor body portion in the absence of the shallow surface layer, has an increased or decreased effective barrier height, depending on the relative conductivity types of the shallow surface layer doping and the doping of the semiconductor body portion and has a reverse characteristic which is not seriously degraded by the presence of the shallow surface layer. Thus, although in general the magnitude of the reverse current is changed, the slope of the reverse current-voltage characteristic is not significantly different and the reverse break-down voltage is not seriously reduced. The change of effective barrier height in accordance with the present invention is achieved by controlling the electric field at the surface of the semiconductor. The magnitude of this surface field is controlled substantially by the total number of effectively active dopant atoms in the shallow surface layer. It should be stressed that the physical mechanism involved is quite different from that which causes slight variations in barrier height due to changing the number of surface states at the metal-semiconductor interface, for example by cleaning the semiconductor surface prior to providing the metal electrode.

Such Schottky barriers of devices in accordance with the invention are useful in different device contexts. Thus, in discrete Schottky diodes or in integrated circuit devices such as logic circuits which include integrated Schottky barriers, the effective barrier height of a particular technology desirable metal-semiconductor barrier combination can be adjusted to a more desirable value for the circuit application. The magnitude of the reverse leakage current below break-down is controllable by controlling the doping of the shallow surface layer and can be used to provide a substantially constant current source. In high power Schottky barrier rectifiers a decreased effective barrier height for a given metal-semiconductor combination can assist in reducing drop. Furthermore, a decreased effective barrier height due to the presence of the shallow surface layer may assist in reducing burn-out in high power Schottky diodes. In this letter case, it is thought that when a local hot spot occurs in the diode and the metal of the electrode locally penetrate through the said shallow surface layer to the said bulk, the barrier height at this hot spot becomes higher than the decreased effective barrier height elsewhere, so effecting local switch-off at the hot spot.

Preferably the doping level of the semiconductor body portion is sufficiently low, for example at most of the order of $10^{15}$ dopant atoms/c.m$^3$, that the reverse current saturates to a substantially constant value with voltage below breakdown.

The more highly doped surface layer is so shallow as to be substantially depleted of charge carriers in the zero bias condition of the barrier. Preferably, the depth of the shallow surface layer may be at most 150 A (0.015 microns). Such shallow layers can be formed in a controllable manner with substantially uniform depth by implantation. It will be noted that such layers are more than forty times shallower than the p-type implanted well which is described in the said article in TEEEJ of Solid State Circuits SC4 (1969), p. 280 -284.

By controlling the degree of doping of the shallow surface layer, the degree by which the barrier height can be lowered or raised is readily controlled. Preferably, the doping level of the shallow surface layer may be at least $5 \times 10^{17}$ dopant atoms/cm$^3$, and is preferably at least two orders of magnitude higher than the doping level of the said semiconductor body portion.

The effective barrier height can be readily changed by at least 0.15 eV. Thus, for example, it may be lowered by more than 0.2 eV. To achieve this same degree of lowering by merely increasing the doping of the semiconductor body portion would be difficult, as in general such a high doping would be required that the barrier would have a very low break-down voltage, for example of approximately one volt for a metal-silicon barrier. However, in accordance with the present invention, the height of nickel on n-type silicon Schottky barriers has been lowered by as much as 0.3 eV while maintaining a break-down voltage of above 35 volts.

When the doping of the shallow surface layer is of the same conductivity type as the semiconductor body portion of the effective barrier height is lower than the height of the barrier which the said metal electrode would form with the semiconductor body portion in the absence of the said shallow surface layer. This lowering of barrier height is thought to result from both tunnelling and image force lowering. In the former case, due to the higher doping and shallow depth of the shallow surface layer, the semiconductor energy bands are steeply curved adjacent the metal electrode so that the barrier is narrow enough for tunnelling of charge carriers.

When the doping of the shallow surface layer is of opposite conductivity type to that of the semiconductor body portion, the effective barrier height is higher than the height of the barrier which the said metal electrode would form with the semiconductor body portion in the absence of the said shallow surface layer. This increase in effective barrier height results from a diffusion potential between the opposite conductivity type areas in series with the barrier.

According to a second aspect of the present invention there is provided a method of manufacturing a semiconductor device comprising the provision of a Schottky barrier of predetermined barrier height, between a metal electrode and a semiconductor body portion, in which, by using ion bombardment, dopant is implanted in the body portion to form a shallow, higher doped, surface layer where the said Schottky barrier is to be formed, characterized in that of the ion dose is chosen to provide the required higher doping level of the shallow surface layer for controlling the value of the effective height of the barrier, the ion energy being chosen to provide the depth of the shallow surface layer such that the layer is substantially depleted of charge carriers in the zero bias condition of the barrier as a result of which the slope of the reverse current-voltage characteristic (which is the impedance in the reverse bias condition) of the barrier below break-down is determined by the doping of the said semiconductor body portion substantially independently of the presence of the said shallow surface layer.

The dopant may be implanted in the body portion (recoil implantation) from a layer comprising the dopant, which dopant layer is provided on the surface of said body portion and is bombarded with ions to effect the recoil implantation.

However, the ion bombardment may be of ions of the dopant which are implanted in the body portion. The dopant ion dose is chosen in accordance with the requirement barrier height and may be of the order of $10^{12}$ dopant ions/cm$^2$. The doping level of the shallow surface layer formed by ion implantation can be estimated from the ion dose and the depth of the shallow surface layer which is determined by the range in the semiconductor material of the ions of the particular energy chosen. For ion doses of $10^{12}$ to $10^{13}$ dopant ions/cm$^2$ implanted to form a shallow surface layer having a depth of at most 150 A the doping level of the layer formed is of the order of approximately $10^{18}$ to $10^{19}$ dopant atoms/cm$^3$. This is considerably higher than the doping levels typically chosen for the said semiconductor body portion, usually of the order of $10^{15}$ dopant atoms/cm$^3$.

Other features of methods in accordance with the present invention will be evident from the previous description of a semiconductor device in accordance with the invention and from the following specific description of various embodiments of the first and second aspects of the invention. These embodiments will now be described, by way of example, with reference to the accompanying drawings, in which.

Figure 1:
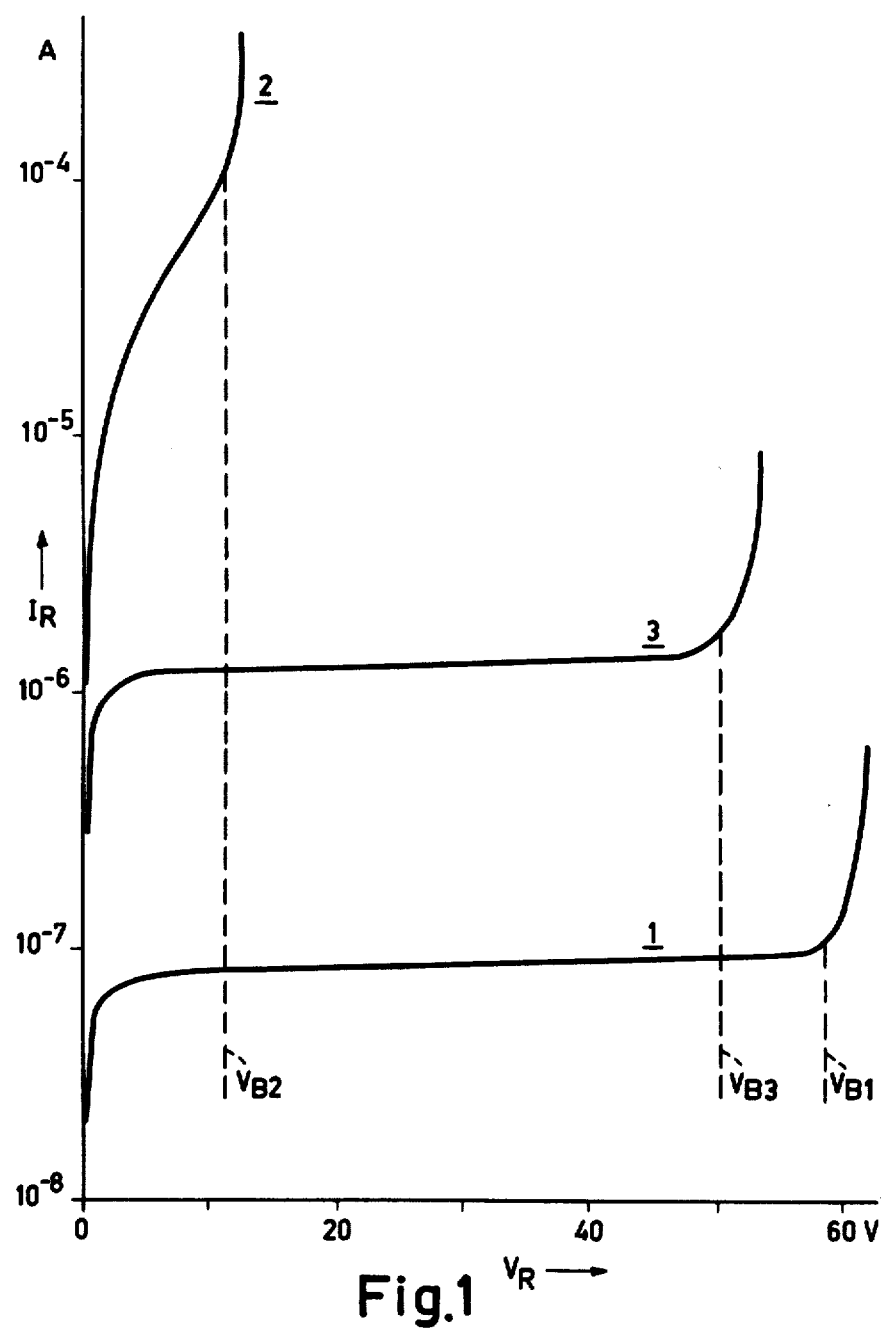
FIG. 1 is a diagrammatic representation of the reverse characteristics of a conventional Schottky barrier, a Schottky barrier having a height reduced as a result of increased doping of the semiconductor body, and a Schottky barrier in accordance with the present invention.

In the representation of FIG. 1, $I_R$ denotes the reverse current in Amps which flows across the barrier with applied reverse voltage $V_R$ in volts. Curve 1 represents the reverse-characteristic of a conventional Schottky barrier diode. An example of such a barrier is a nickel electrode on an n-type epitaxial layer having a donor doping of approximately $5 \times 10^{14}$ donor atoms/cm$^3$. Such a conventional Schottky barrier has a high break-down voltage $V_{B1}$, for example of approximately 60 volts. Below break-down the reverse current saturates to a substantially constant low value, for example, of approximately 90 nano Amps. Such a conventional nickel on n-type silicon Schottky barrier has a barrier height of approximately 0.59 eV.

By using the same metal and increasing the doping of the epitaxial layer for example to approximately $10^{18}$ atoms/c.c. the height of such a conventional barrier at zero bias can be reduced by approximately 0.09 eV. However, Curve 2 represents the effect of this increased doping on the reverse characteristic of the barrier. It will be noted that the break-down voltage $V_{B2}$ is much smaller than $V_{B1}$ and that the reverse current $I_R$ below break-down increases significantly with applied voltage $V_R$. Such a degraded reverse characteristic is undesirable for a Schottky barrier when used in many circuit applications. Therefore, it has been conventional practice to use a different metal rather than a different semiconductor doping in order to produce a different Schottky barrier height.

Curve 3 of FIG. 1 represents the reverse characteristic of a Schottky barrier having an effective barrier height which is reduced by approximately 0.09 eV compared with the conventional diode of Curve 1, and obtained in accordance with the present invention. The break-down voltage $V_{B3}$ is less than 20% lower than $V_{B1}$ and the reverse current $I_R$ below break-down saturates to substantially a constant value an order of magnitude higher than that of Curve 1. The slope of the reverse characteristic (which is the impedance in the reverse bias condition) below break-down is not significantly increased compared with Curve 1.

Figure 4:
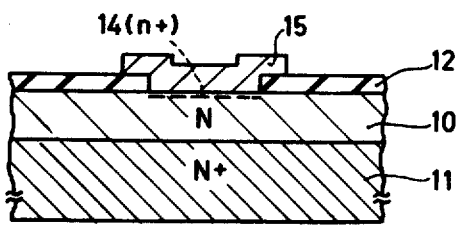
FIG. 4 is a diagrammatic sectional view of a Schottky barrier device in accordance with the present invention.

The manufacture of such Schottky barriers in accordance with the present invention will now be described with reference to FIGS. 2 and 4.

Figure 2:
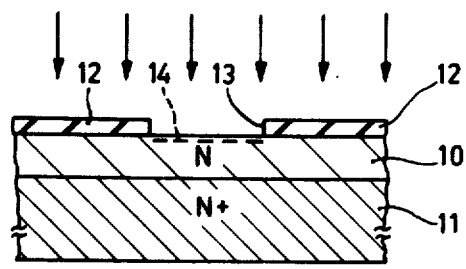
FIG. 2 is a diagrammatic sectional view of a semiconductor body during the manufacture of a Schottky barrier device in accordance with the present invention and using ion implantation.
Figure 3:
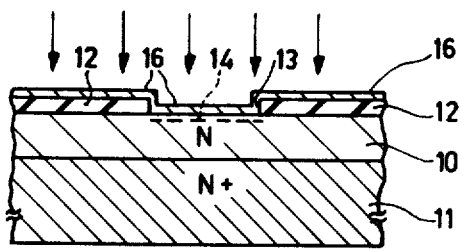
FIG. 3 is a diagrammatic sectional view of a semiconductor body during the manufacture of a Schottky barrier device in accordance with the present invention and using recoil implantation.

The semiconductor body shown in FIGS. 2 and 3 comprises an n-type epitaxial layer 10 on a higher conductivity n-type monocrystalline substrate 11. The body may be of silicon, and epitaxial layer 10 may have a resistivity of approximately 5 ohm-cm. which corresponds to a donor doping of approximately $10^{15}$ atoms/c.c.

In a conventional manner, an insulating layer 12 is provided at the surface of the epitaxial layer 10. A window 13 is provided in the layer 12 where the Schottky barrier is to be formed. The layer 12 may be of silica having a thickness of approximately 2,000 A.

A conventional Schottky barrier could be formed on this epitaxial layer 12 by providing a metal layer electrode, for example of nickel at the window 13. However, in accordance with the present invention a different barrier height is obtained by implanting dopant at the window 13 in a shallow surface layer 14 of substantially uniform depth.

This implantation may be effected by bombarding the semiconductor body with a beam of low energy dopant ions as denoted by the arrows in FIG. 2. To produce a Schottky barrier of lower barrier height, donor ions are implanted into the n-type epitaxial layer. The ion mass and ion beam energy are chosen such that the depth of the implanted layer 14 formed is at most approximately 150 A (0.015 microns). This choice is based on ion ranges in the semiconductor material, and for example, approximately 10 KeV antimony ions may be used as a donor dopant for implantation in silicon. The ion dose is chosen in accordance with the desired degree of barrier height lowering. Typical values used for the nickel on n-type silicon barriers were in the range of $10^{12}$ to $10^{13}$ donor ions/cm$^2$. The insulating layer 12 is thick enough to mask the underlying semiconductor against implantation, so that implantation in the epitaxial layer 10 may occur at the window 13.

Before the implantation, the epitaxial-layer surface at the window 13 is cleaned, for example by dip-etching in dilute hydrofluoric acid and washing in alcohol to inhibit oxide growth. After the implantation, the implanted structure is annealed, for example by heating in vacuo for 15 minutes at 750° C. The surface of the shallow implanted surface layer 14 is then further cleaned by a dip-etch and an alcohol-wash, after which metal electrode 15, for example of nickel, is provided. The electrode 15 may be provided by evaporating nickel onto the insulating layer 12 and surface layer 14 at room temperature and subsequently defining the lateral configuration of the electrode 15 by etching. The resulting structure is shown in FIG. 4. The electrode 15 forms with the epitaxial layer 10 a Schottky barrier having a height determined by the doping of the shallow surface layer 14 and a reverse characteristic of the type denoted by curve 3 in FIG. 1.

Figure 6:
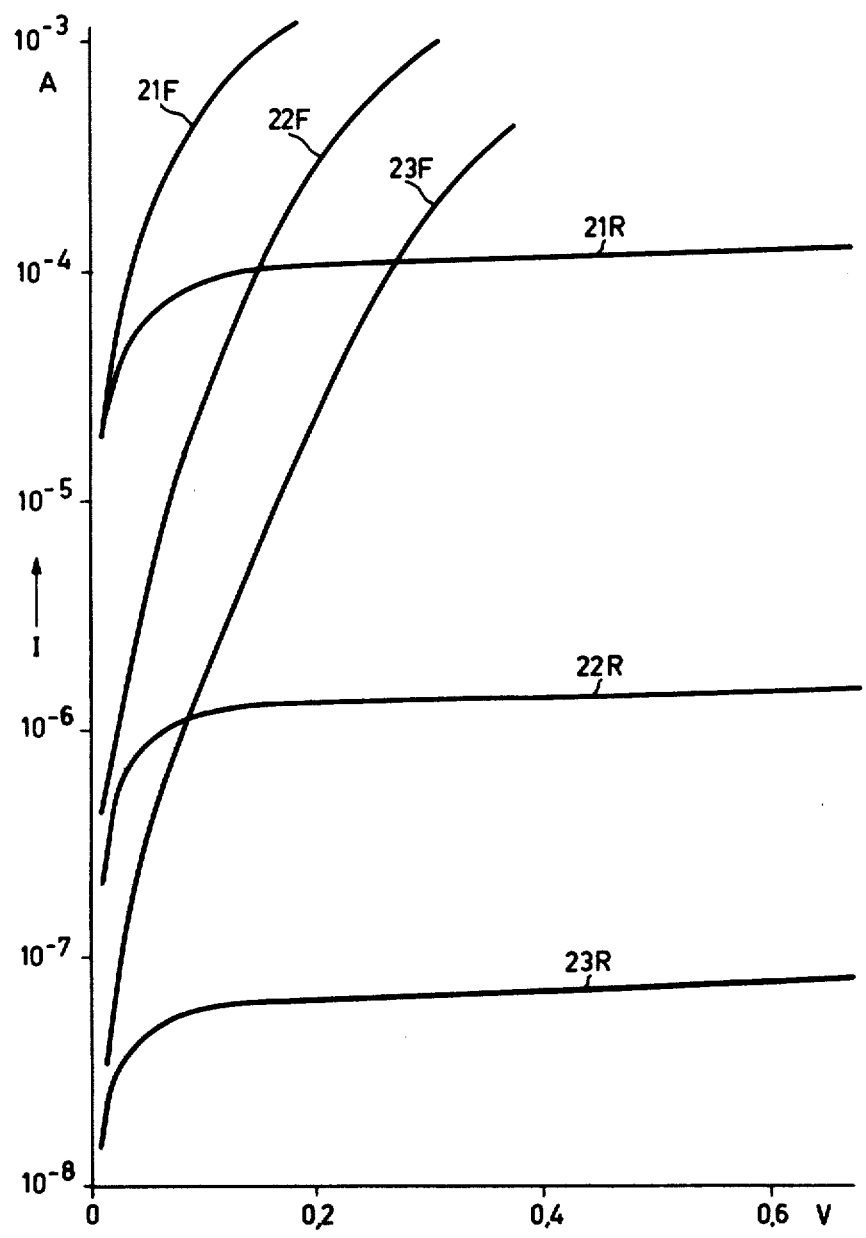
FIG. 6 is a graph showing part of the forward and reverse characteristics of various nickel on n-type silicon Schottky barriers manufactured using the process illustrated in FIGS. 2 and 4.

The graph of FIG. 6 shows an enlarged part of the forward characteristics 21F and 22F, and reverse characteristics 21R and 22R below break-down of two Schottky barriers 21 and 22 made by such an ion implantation method using n-type epitaxial layers 10 having a donor doping of $5 \times 10^{14}$ atoms/cm$^3$. The forward or reverse current I is in Amps and the forward or reverse voltage V is in Volts. The curves correspond to the following antimony ion doses and energies:

Curves 21F and 21R — $5 \times 10^{12}$/cm$^2$ at 10 KeV
Curves 22F and 22R — $2 \times 10^{12}$/cm$^2$ at 10 KeV The curves 23F and 23R are for a reference Schottky barrier 23 made on an n-type epitaxial layer 10 having a doping of $5 \times 10^{14}$ donor atoms/cm$^3$ but having no additional shallow implanted surface layer. Such a diode is of the conventional type, the whole reverse characteristic of which is of the type denoted by curve 1 in FIG. 1.

All these barriers 21, 22 and 23 were formed by a nickel electrode 15 at a circular contact window 13 having a diameter of 100 microns.

At an antimony ion energy of 10 KeV the depth of the implanted n - layer 14 formed is substantially uniform and is approximately 100 A. It is sufficiently shallow that the depletion layer of the barrier at zero bias extends beyond the implant for curves 21F and R and 22F and R and into the epitaxial layer 10. Thus the shallow implanted suface layer 14 is depleted of charge carriers in the zero bias condition of the barrier. As a result, the slope of the reverse characteristic is determined by the doping of the epitaxial layer 10, substantially independently of the presence of the implanted layer 14.

The barrier heights measured for these three Schottky barriers 21, 22 and 23 were 0.46 eV, 0.50 eV and 0.59 eV. The break-down voltages measured for these Schottky barriers 21 and 22 in accordance with the invention were approximately 45 volts and 50 volts respectively.

Figure 7:
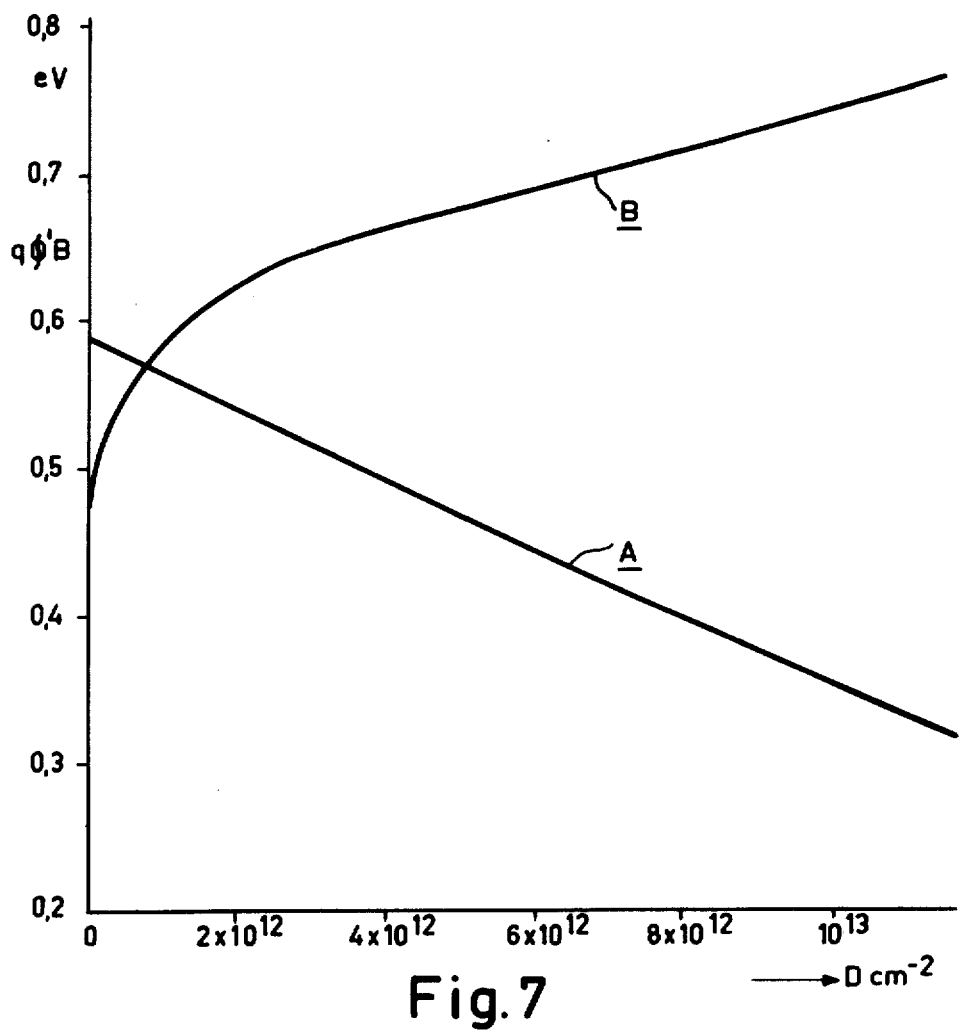
FIG. 7 is a graph showing the increase and decrease of effective barrier height as a function of implanted ion dose.

Further results for nickel on n-type silicon barriers are given by curve A in FIG. 7. In this case, the previously-described 10 KeV antimony implant is replaced by a 5 KeV antimony implant producing a slightly shallower implanted layer and the n-type epitaxial layer has a doping of $2 \times 10^{15}$ atoms/c.c. (2 ohm-cm). Curve A shows the reduction of barrier height $c\phi_b$ in eV as a function of the antimony ion dose. It will be noted that at a dose of $10^{13}$ per cm$^2$ the barrier height of the nickel on n-type silicon barrier is reduced by approximately 0.2 eV.

FIG. 3 illustrates an alternative method of implanting the shallow surface layer 14. In this case, after the cleaning, a thin dopant layer 16, for example a 400 A thick antimony layer 16, is provided and bombarded with ions to cause antimony to recoil into the underlying insulating and epitaxial layers 12 and 10. The insulating layer 12 is thick enough to mask the underlying semiconductor against antimony implantation which is therefore localised to the window 13. A 100 KeV krypton ion beam may be used. Preferably most of the bombarding ions are absorbed in the dopant layer 16 and do not penetrate to the epitaxial layer 10. Subsequently, during an anneal for example 750° C in vacuum, the antimony layer 16 sublimates to leave the recoiled antimony in a shallow layer 14 in the epitaxial layer 10. The metal electrode is subsequently provided as described hereinbefore after cleaning the surface. In such a case, using a 200 A thick antimony layer 16 and a 100 KeV krypton ion dose of $2 \times 10^{14}$ per cm$^2$, the barrier height of a nickel on n-type silicon Schottky barrier was reduced to approximately 0.39 eV. The reverse characteristic was similar in form to that denoted by curve 3 in FIG. 1.

FIG. 3 illustrates an implantation step in a method of increasing the effecting height for a nickel on n-type silicon barrier. This case is similar to that illustrated in FIG. 2 except that the dopant ions are of opposite conductivity type to the epitaxial layer 10. In this case, the layer 10 and substrate 11 are of p-type conductivity. An antimony ion beam may be employed, for example at an energy of 5 KeV. Subsequently, as described in the previous examples, a nickel electrode may be provided to form the Schottky barrier. Using such a method, the effective height of a nickel on p-type silicon Schottky barrier may be raised by, for example, approximately 0.3 eV.

Figure 5:
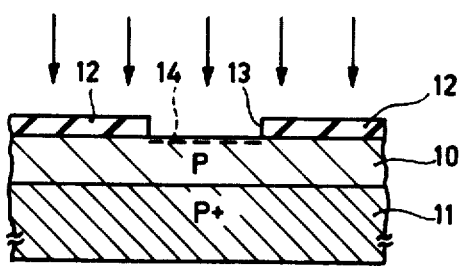
FIG. 5 is a diagrammatic sectional view of a semiconductor body during the manufacture of another Schottky device in accordance with the present invention.

Some results for such barrier rasing in accordance with the embodiment of FIG. 5 are given by curve B of FIG. 7 which shows the increase of barrier height $c\phi_B$ in eV as a function of the antimony ion dose D implanted per cm$^2$ for a p-type epitaxial layer doping of $4 \times 10^{16}$ atoms/cm$^3$. The antimony ion beam energy is 5 KeV, and the annealing temperature is 750° C. It will be noted that at a dose of $10^{13}$/cm$^2$ the barrier height is increased by approximately 0.25 eV.

Figure 8:
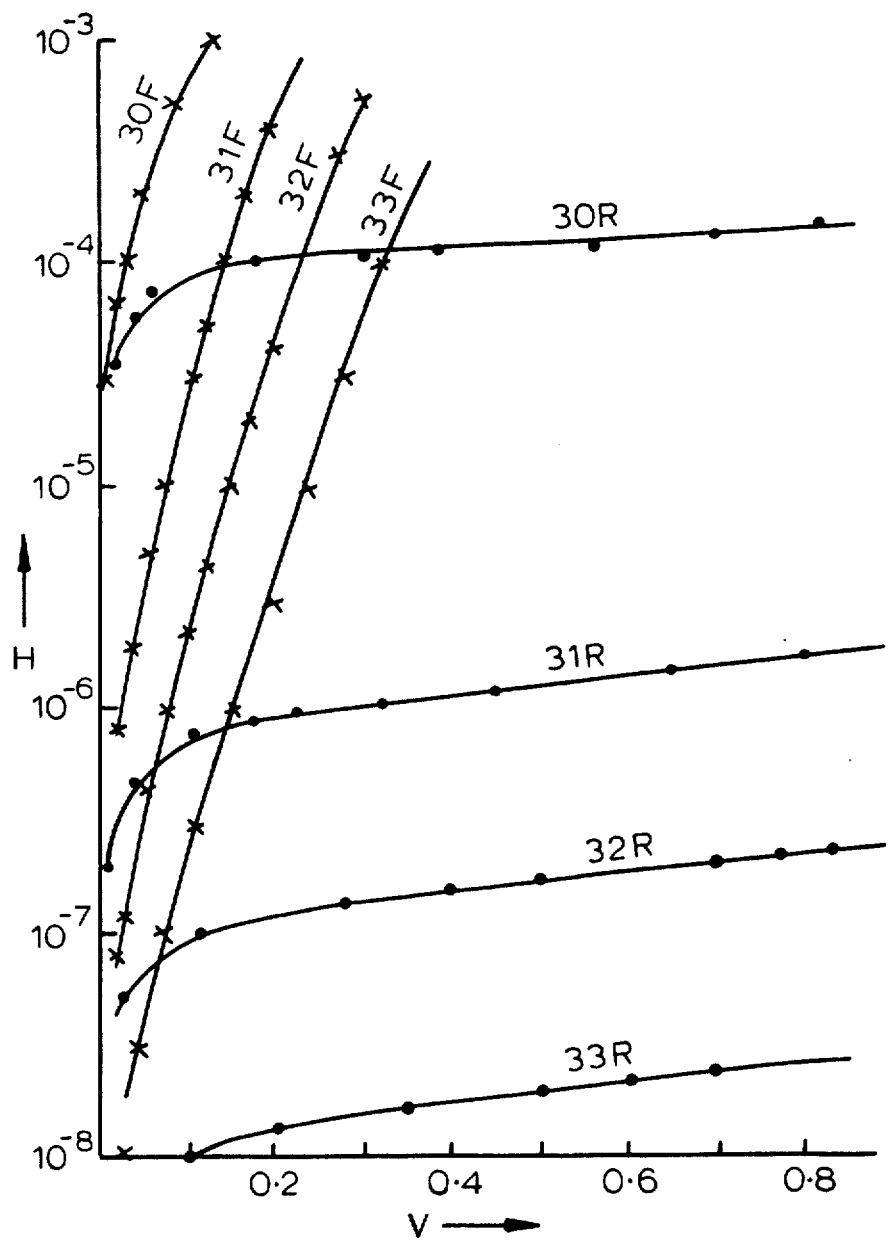
FIG. 8 is a graph showing part of the forward and reverse characteristics of various nickel on n-type silicon Schottky barriers manufactured using the process illustrated in FIG. 5.

FIG. 8 shows an enlarged part of the forward characteristics 31F, 32F and 33F and reverse characteristics 31R, 32R and 33R below break-down of Schottky barriers 31, 32 and 33 made by such an ion implantation method using 0.4 ohm.cm. p-type epitaxial layers. The forward or reverse current I is in amps and the forward or reverse voltage V is in volts. The curves correspond to the following 5 KeV antimony ion doses:

Curves 31F and R: $2 \times 10^{12}$/cm$^2$
Curves 32F and R: $5 \times 10^{12}$/cm$^2$
Curves 33F and R: $1 \times 10^{13}$/cm$^2$.

The curves 30F and R are for a reference Schottky barrier 30 made on a p-type epitaxial layer having a resistivity of 0.4 ohm.cm. but having no additional shallow implanted surface layer. Such a diode is of the conventional type.

All these barriers 30, 31, 32 and 33 were formed by a nickel electrode at a circular contact window 13 having a diameter of 400 microns.

At an antimony ion energy of 5 KeV the depth of the implanted layer 14 is substantially uniform and less than that formed by 10 KeV ions, and is fully depleted at zero bias.

The break-down voltage of the reference Schottky diode 30 was approximately 10 volts. The break-down voltages of the diodes 31, 32 and 33 were higher, for example that of diode 31 was approximately 15 volts. This increase in breakdown voltage is an additional feature of the barrier height raising technique. It appears to result from an increase in the barrier height around the periphery of the Schottky contact, which increase is slightly greater than that at the center of the Schottky contact and reduces the degradation of the reverse characteristic which arises from the higher field around the periphery of the contact.

Figure 9:
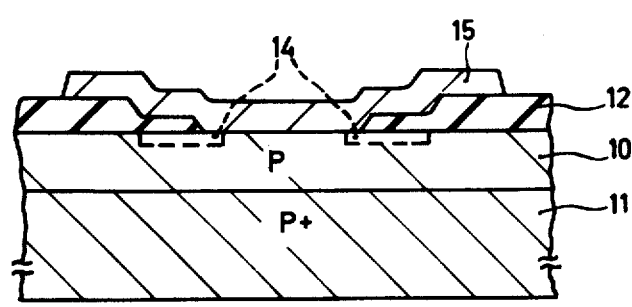
FIG. 9 is a diagrammatic sectional view of a semiconductor body of a further Schottky barrier device in accordance with the present invention.

FIG. 9 shows a further embodiment in which a shallow high-doped antimony-implanted layer 14 is provided locally around the periphery of the Schottky contact to increase the barrier height around this periphery thereby reducing the degradations of the diode characteristics which arises from the higher field around this periphery. In this case the effective barrier height of the whole Schottky contact is determined by the main, non-periphery portion of the contact.

From these results it can be seen that shallow surface layers in the Schottky-barrier system enable barrier heights to be controlled over a wide range and bring considerable flexibility to the system. Although the results were for nickel-silicon barriers controlled using antimony-doped surface layers, other metal-semiconductor combinations can be used and different dopants for the shallow surface layer. Thus, for example aluminum Schottky barriers to p-type silicon could be made with barrier-heights suitable for application to Schottky-clamped p-n-p transistors. Indium may be used an an acceptor dopant for forming shallow surface layers which may be used to raise the barrier formed on n-type substrates and produce diodes with near-ideal characteristics. Different semiconductors, for example gallium arsenide, may be used.

In general the maximum reduction of barrier height obtainable without degradation of the reverse characteristic depends on the metal used to make the Schottky-contact and will be greater for metals giving a higher barrier height. Thus, a gold on n-type silicon barrier, for example, having a normal barrier-height of approximately 0.8 eV, can be reduced by approximately 0.4 eV using 5 KeV antimony to form a shallow surface layer below the gold electrode.

What is claimed is:

1. A method of manufacturing a semiconductor device having a Schottky barrier of desired barrier height between a metal and a semiconductor body portion but without significant degrading of its reverse characteristics, comprising providing a semiconductor body portion of given doping level which if directly contacted with a metal capable of forming therewith a Schottky barrier would result in a barrier of given height different from the desired barrier height, subjecting the said body portion to dopant ion bombardment to implant dopant therein to form a shallow surface layer having a higher doping level than said given doping level, the implanted ion dose being such as to change the given barrier height to that desired when contacted by said metal, the bombarding ion energy being such as to restrict the depth of the implanted layer from the surface to such a small value that it remains below the thickness of the depletion layer extending from the Schottky barrier in the zero bias condition of the barrier, whereby the implanted layer remains substantially depleted of charge carriers and the reverse characteristics of the barrier will not be significantly degraded, applying said metal as a contact to said body portion such that the barrier is formed between said metal and said shallow surface layer, and making an electrical connection to the body portion.

2. A method as claimed in claim 1 wherein the semiconductor body portion provided has a doping level at most of the order of $10^{15}$ dopant atoms/per $cm^3$.

3. A method as claimed in claim 2 wherein the ion energy is chosen such that the depth of the implanted shallow surface layer is at most 150 A.

4. A method as claimed in claim 3 wherein the dopant level of the shallow surface layer is at least $5 \times 10^{17}$ dopant atoms/$cm^3$.

5. A method as claimed in claim 4 wherein the implanted dopant is of the same conductivity type as said semiconductor body portion as a result of which the effective barrier height of the barrier formed is lower than said given barrier height.

6. A method as claimed in claim 5 wherein the effective barrier height is lowered by more than 0.15 eV.

7. A method as claimed in claim 4 wherein the implanted dopant is of opposite conductivity type to that of said semiconductor body portion as a result of which the effective barrier height of the barrier formed is higher than said given barrier height.

8. A method as claimed in claim 7 wherein the effective barrier height is increased by more than 0.15 eV.

9. A method as claimed in claim 3 wherein the dopant ion dose is at least $10^{12}$ dopant ions per $cm^2$.

10. A method as claimed in claim 9 wherein the dopant ion dose is approximately $10^{13}$ dopant ions per $cm^2$.

11. A method as claimed in claim 1, in which said dopant ions are of antimony.

12. A method as claimed in claim 1, in which the dopant ion implantation is effected through a window in an insulating layer on the surface of said body portion, after which the structure is subjected to a dip-etch, and the metal is then provided to form the Schottky barrier at the window and to overlap the insulating layer at the edge of the window.

13. A method as claimed in claim 1, in which said dopant is implanted to form said shallow implanted surface layer across substantially the whole area where the Schottky barrier is to be formed between the metal and said body portion so as to determine the effective barrier height between said metal and said body portion.

14. A method as claimed in claim 1, in which said dopant is implanted to form said shallow implanted surface layer at only part of the whole area where the Schottky barrier is to be formed between said metal and said body portion so that the effective barrier height around the periphery of said barrier is higher than that of the non-peripheral portion of said barrier.

15. A method as claimed in claim 1, in which the metal is of gold, and the effective barrier height between the gold and said body portion is reduced by 0.4 eV.

16. A method as claimed in claim 1, in which said body portion is of gallium arsenide.

17. A method as claimed in claim 1, in which said body portion is of silicon.

18. A method as claimed in claim 17, in which said metal is of nickel.

19. A method as claimed in claim 17, in which said metal is of aluminum.

* * * * *